United States Patent

[11] 3,573,684

[72] Inventor George R. Dickinson
Norridge, Ill.
[21] Appl. No. 803,215
[22] Filed Feb. 28, 1969
[45] Patented Apr. 6, 1971
[73] Assignee Zenith Radio Corporation
Chicago, Ill.

[54] TUNER FOR A WAVE SIGNAL RECEIVER
4 Claims, 5 Drawing Figs.

[52] U.S. Cl. .......... 334/15, 334/8, 325/390, 250/217
[51] Int. Cl. .......... H03j 3/18, H03j 5/24
[50] Field of Search .......... 334/15, 8; 250/206, 215, 217, 212, 208, 229; 325/390—3, 63, 64; 328/2

[56] References Cited

UNITED STATES PATENTS

| | | | |
|---|---|---|---|
| 2,140,368 | 12/1938 | Lyle | 250/225 |
| 2,206,072 | 7/1940 | Barthelemy | 250/206X |
| 2,273,537 | 2/1942 | Rehder | 334/8 |
| 2,862,416 | 12/1958 | Doyle | 250/211X |
| 2,879,405 | 3/1959 | Pankove | 250/211 |
| 3,040,262 | 6/1962 | Pearson | 332/30X |
| 3,233,197 | 1/1966 | Deichen | 334/15 |
| 3,325,593 | 6/1967 | Platt et al. | 334/8X |
| 3,443,205 | 5/1969 | Ludwig et al. | 307/320X |

OTHER REFERENCES

APPLIED ELECTRONICS - Gray (Second Edition) John Wiley & Sons, Inc. New York 1957 TK7860M3 pages 117—119

*Primary Examiner*—Herman Karl Saalbach
*Assistant Examiner*—Marvin Nussbaum
*Attorneys*—Francis W. Crotty and James E. Tracy

ABSTRACT: A variable amplitude DC control voltage, for tuning varactor-diode type tunable circuitry, is developed by a light-controllable voltage source having a light-sensitive device, such as a light-dependent resistor, exposed to an adjustable amount of light. In response to different discrete light levels, the control voltage assumes different discrete amplitude levels which in turn effect tuning to different broadcast channels.

Patented April 6, 1971 3,573,684

2 Sheets-Sheet 1

Inventor
George R. Dickinson
By James E. Tracy
Attorney

Patented April 6, 1971 3,573,684

2 Sheets-Sheet 2

Inventor
George R. Dickinson
By James E. Tracy
Attorney

TUNER FOR A WAVE SIGNAL RECEIVER

BACKGROUND OF THE INVENTION

This invention relates to a novel tuning system for selectively tuning a wave signal receiver to different channels or broadcasting stations. The invention is particularly attractive when incorporated in a multiposition tuner for a television receiver, and will be described in such an environment.

Most conventional tuners presently in use include tunable circuits which are either (1) continuously adjustable, employing variable tuning elements, such as inductance coils or capacitors, that are physically adjustable to change their electrical values to achieve tuning to different channels as the tuner is actuated to different positions, or are (2) step-by-step adjustable with different selected tuning elements of fixed value being switched into the tunable circuits in each tuner position to accomplish tuning to different channels. Tuners have been developed in which the tuning elements of the tunable circuits take the form of voltage controlled variable capacitance diodes, commonly called varactor diodes, the capacitance of each diode being determined by the magnitude of an applied DC control voltage. By varying the control voltage's amplitude level, the resonant frequency of each tunable circuit may be changed to tune the tuner to different channels.

Such varactor-diode type tuners represent substantial improvements over the conventional tuners currently in use. A major advantage, particularly over the step-by-step tuner, is that relatively few switching contacts are needed in a varactor-diode tuner. Tuner contacts have always been a source of trouble and malfunctioning attributable to their wear, oxidation, sulfiding, dirt accumulation, etc. These actions, among other things, introduce contact resistance resulting in the production of noise in the tuner's output signal.

In some varactor-diode tuners developed heretofore, merely by adjusting a potentiometer the amplitude of the DC control voltage applied to each diode may be changed over an amplitude range appropriate to tune over the entire frequency band to be covered by the associated receiver. Other tuners are of the step-by-step variety and feature a series of pretuned or preset tuner positions. This is achieved by employing, and rendering operative, a different potentiometer in each position. Unfortunately, although only a few electrical contacts are required in a varactor-diode tuner, usually at least one of them (the movable tap of a potentiometer) is a wiping or sliding contact which of course is very susceptible to corrosion, dirt accumulation, etc. As a consequence, the varactor-diode tuners designed to date have not been entirely free of noise problems, especially in the introduction of undesired noise in the tuner's output signal during each time interval when the tuner is changed to a different channel.

The present invention constitutes a significant advance in the art since applicant's tuning system, without the employment of any contacts whatsoever, provides an adjustable amplitude DC control voltage capable of selectively tuning varactor-diode type tunable circuitry over a wide range of the frequency spectrum and covering a large number of broadcast channels. Of substantial importance, no potentiometers with their troublesome sliding contacts are needed. Applicant's tuner provides the ultimate in noise-free performance, reliability and long life.

Another major advantage of the present invention resides in the relatively low torque required to actuate or position applicant's tuner. When contacts (sliding or otherwise) must be switched or repositioned when the tuner is actuated, as in the prior art, relatively high contact forces are customarily employed in an attempt to at least minimize contact resistance and its undesired resultant effects. Unfortunately, with such high contact forces considerable force, or torque when the tuner is of the rotatable type, is necessary to move the tuner from one position to the next. This is not so in applicant's tuner inasmuch as no contacts need be switched. Permitting tuner manipulation with only a small turning torque eases significantly manual tuning on the part of the operator. When the tuner is to be remotely controlled, the low torque may easily be handled by an inexpensive mechanical drive, such as a ratchet solenoid drive. In the past, the high torques necessitated the employment of expensive motor-gear trains for remotely controlled tuners.

Accordingly, it is an object of the invention to provide, for a wave signal receiver, a new and improved tuning system that is considerably more reliable and noise immune than prior tuners.

It is another object to provide a contactless tuner which achieves selective tuning to any of several different broadcast channels.

An additional goal is to produce, without utilizing any sliding or wiping contacts, a variable amplitude control voltage for tuning varactor-diode type tunable circuitry.

A further object of the invention is to provide a rotatable multiposition tuner which may be rotated from one position to the next with relatively little turning torque.

SUMMARY OF THE INVENTION

A tuner, for selectively tuning a wave signal receiver to any one of several different broadcast channels, constructed in accordance with one aspect of the invention comprises a light-controllable voltage source which includes at least one light-sensitive device and provides, in response to incident light received by the device, a voltage of a magnitude determined by the amount of such incident light. Control means are included for exposing the light-sensitive device to a controllable amount of light to effect the development, by the voltage source, of a control voltage whose amplitude is variable as between several different discrete amplitude levels each of which is assigned to, and effectively designates, a different respective one of the broadcast channels. There are tunable means responsive to the control voltage for tuning the receiver to the particular channel designated by the voltage's amplitude level at the time.

DESCRIPTION OF THE DRAWINGS

The features of the invention which are believed to be novel are set forth with particularity in the appended claims. The invention, together with further objects and advantages thereof, may best be understood, however, by reference to the following description in conjunction with the accompanying drawings in which like reference numbers identify like elements, and in which:

DESCRIPTION OF THE ILLUSTRATED EMBODIMENT

While the invention is practiced in conjunction with a television tuner, the particular frequency band or bands to be served by applicant's tuner are actually of no concern. The tuner may, for example, constitute a radio tuner and be designed to select any channel in the AM and/or FM bands or in any of the short wave bands. As shown, it is contemplated that the tuner comprise an all-channel television tuner capable of selecting any one of the 82 channels in the VHF and UHF bands. In accordance with the transmission standards existing in the United States, the television channels occupy three spaced-apart portions or ranges of the frequency spectrum. Channels 2—6, called the low VHF channels, fall within the range 54—88 megahertz; channels 7—13, referred to as the high VHF channels, occupy the band 174—216 megahertz; while the UHF channels 14—83 cover the range of 470—890 megahertz. The channels within each band are uniformly spaced and each channel extends over a bandwidth of 6 megahertz.

Figures 1, 3, 4, 5:
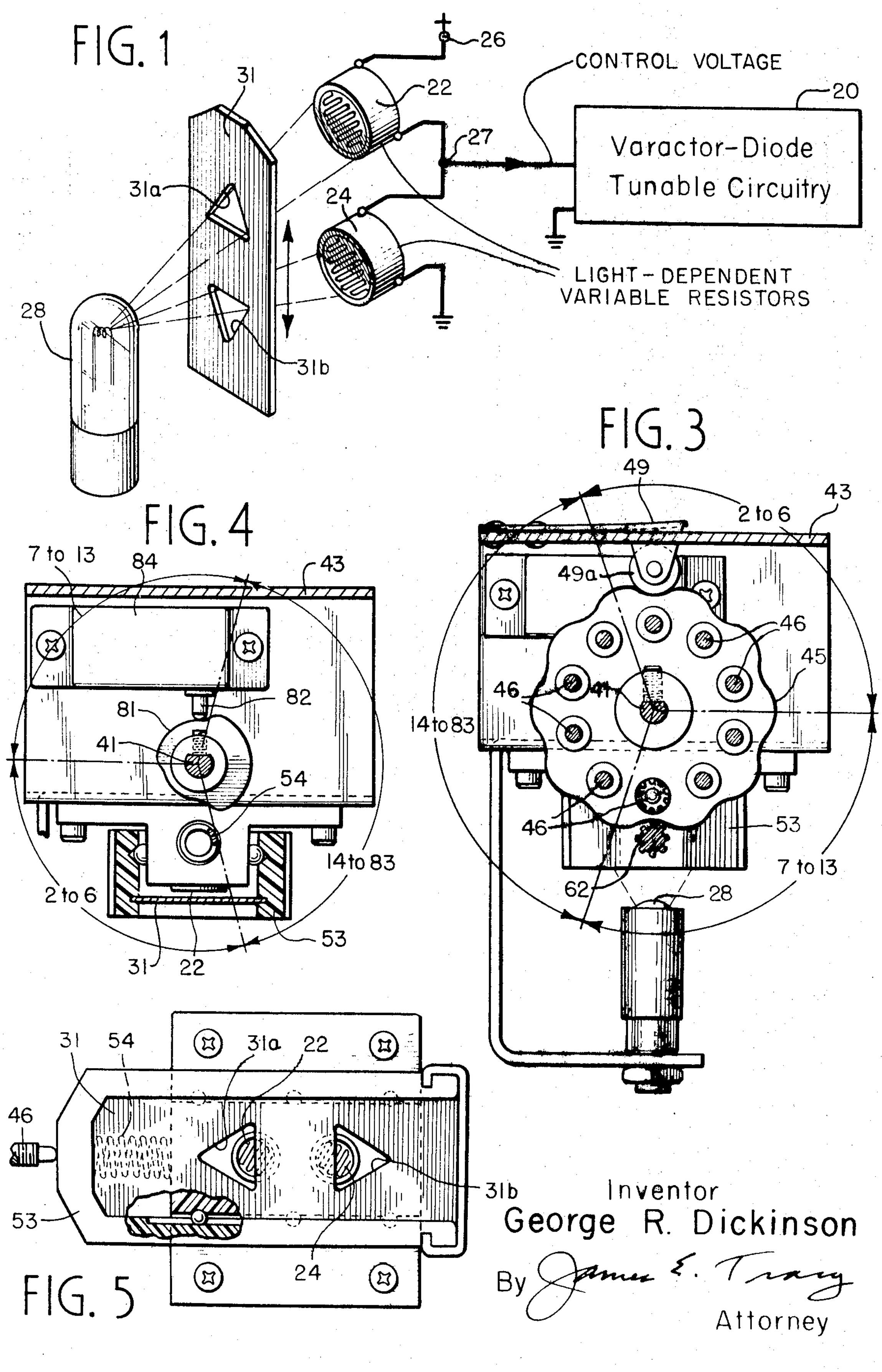
FIG. 1 is a schematic representation of a multiposition television tuner embodying the invention, and in simplified and abbreviated form illustrates most clearly the manner in which the invention operates.
FIG. 3 is a sectional view taken along section line 3–3 in FIG. 2.
FIG. 4 is a sectional view taken along section line 4–4 in FIG. 2.
FIG 5 is a sectional view taken along section line 5–5 in FIG. 2.

In describing the television tuner, consideration will initially be given to the simplified diagram of FIG. 1 which illustrates the basic inventive concept. The tunable means, namely the varactor-diode tunable circuitry, is simply shown in FIG. 1 by a block 20. In response to an applied control voltage, tunable means 20 is tuned to a frequency determined by the particular amplitude level of the applied voltage. An appropriate control voltage for the tunable circuitry is developed, in accordance with the invention, by a light-controllable voltage source comprising a pair of light-sensitive devices 22, 24, specifically taking the form of light-dependent variable resistors, series-connected between the positive terminal 26 of a source of DC or unidirectional operating potential and the negative terminal of that source which is grounded. Each of resistors 22, 24 may comprise a photoresistive, cadmium sulfide cell which presents an impedance of a magnitude inversely proportional to the amount of light received thereby. The control voltage for tunable circuitry 20 is derived at the junction 27 of the two resistors. Its magnitude is dependent on the amount of incident light striking each of resistors 22, 24.

A control means if provided for exposing each of light-sensitive devices 22, 24 to a controllable amount of light to vary the amplitude of the control voltage at junction 27. Since the channels are spaced apart and occupy specific discrete positions in the frequency spectrum, the voltage's amplitude is effectively varied as between several different discrete amplitude levels each of which is assigned to, and designates a different television channel. This is accomplished by a light source 28, in the form of a conventional incandescent lamp, which projects light through a pair of triangular shaped apertures 31*a*, 31*b* of a movable shutter or gate 31 toward resistors 22, 24 respectively. Each of the resistors has a circular light-receiving area or face and the percentage of that area that receives light from lamp 28 is determined by the location of shutter 31 at the time. As shown in FIG. 1, shutter 31 is so positioned that half of each area (the upper half of resistor 22 and the lower half of resistor 24) receives light from source 28. Hence, only 50 percent of the maximum amount of receivable light actually falls on each of the resistors. With equal quantities of light reaching resistors 22 and 24, each exhibits the same resistance with the result that the control voltage developed at junction 27 will be of positive polarity and have a magnitude equal to approximately half of that of DC source 26. Upward movement of shutter 31 causes more light to fall on resistor 24 and less on resistor 22. As a consequence, the resistance of resistor 24 decreases while that of resistor 22 increases and this in turn effects a decrease of the control voltage's amplitude. On the other hand, downward movement of shutter 31 produces the reverse result. More light reaches resistor 22 than resistor 24 and the magnitude of the control voltage increases.

The expedient of striking each resistor with an amount of light inversely proportional to that impinging the other is employed merely to halve the manufacturer's tolerances. For example, if the characteristics or properties of each resistor 22, 24 is off by 20 percent, the tolerance is effectively only 10 percent. Obviously, the invention may be practiced by the employment of only a single light-dependent resistor. One way of doing this is by replacing resistor 22 with a resistor of fixed value.

In addition, regardless of whether one or more light-sensitive devices are employed, the device or devices may take any of a variety of different forms. As one other example, each may comprise a photovoltaic cell (such as that used in a light meter), in which case DC voltage source 26 is not needed. A cell of that type, in response to incident light, produces a DC voltage directly and with a magnitude proportional to the amount of such incident light.

The manner in which applicant's basic tuning system shown in FIG. 1 may be incorporated into a practical embodiment is illustrated by the mechanical arrangement of FIGS. 2—5, to which attention is now addressed. In brief, the tuning system is of the rotatable type having ten discrete, detented positions. Each of three of the positions may be preadjusted or preset to tune tunable circuitry 20 to three of the low VHF channels 2—6, three of the positions may be preset to effect tuning to three of the high VHF channels 7—13, and the remaining four of the ten tuner positions may be devoted to preset tuning to four of the UHF channels 14—83. For most geographical locations in the United States, such a pretuned tuner will be quite adequate to receive all of the available television transmissions. Of course, where additional preset positions are desired, the number would be increased. For example, the system could easily be made to exhibit 18 preset tuner positions.

Considering now the details of FIGS. 2—5, a metallic tuning shaft 41 is rotatably mounted to and supported by a mounting bracket 43. Fixed to shaft 41 is a disc 45 which supports, around its circumference, a series of ten equally spaced adjusting screws or controls 46 threaded into guides formed in or made an integral part of the disc. Each of screws 46 is assigned to a respective one of the tuner's ten positions and each is shaped to include a small gear at its left end, as viewed in FIG. 2. The geared head of each screw permits rotation thereof and consequent longitudinal movement of the screw within its guide and along its axis in order that the tuner may be pretuned in each of its ten positions. Disc 45 also functions as an indexing device as its periphery is scalloped to provide a series of ten rounded or concave depressions which cooperate with the detent roller 49*a* of a detent mechanism 49 to afford positive indexing and step-by-step actuation of the tuning assembly through its ten positions. Shaft 41 has a flat on its free end to receive and index a channel selector control knob 51 to facilitate manual positioning of disc 45 and consequently positioning of the tuner itself.

Movable shutter 31 is attached to a plastic carriage 53 guided for movement in a direction parallel to the axis of shaft 41. A coil spring 54 urges the carriage toward disc 45 so that in each tuner position carriage 53 engages the lowermost screw 46 (as viewed in FIG. 2) and assumes a position determined by that screw's axial location. As a result, the amount of light from lamp 28 reaching resistors 22 and 24 (and consequently the control voltage's amplitude and the channel to which the associated receiver is tuned) in each tuner position is controlled by the effective or assigned screw for that position. In each tuner position, the effective screw in conjunction with shutter assembly 31, 53, 54 may be considered an adjustable mechanism for varying the amount of light from source 28 reaching each light-sensitive device 22, 24 to adjust the amplitude of the control voltage to a selected one of several possible discrete amplitude levels each of which is assigned to a different channel.

A fine tuning mechanism is included to facilitate adjustment of each of the ten screws 46 thereby to achieve preset tuning of each of the tuner positions to desired television channels. To this end, a plastic carriage 57 is mounted for slidable movement in a vertical direction as viewed in FIG. 2. Element 56 merely constitutes a spacer between carriage 57 and the hub of disc 45. Carriage 57 is molded to have a stub or pin 57*a* integral therewith. A shaft 58, rotatably mounted in carriage 57, has a pair of pinions 61 and 62 secured to its terminal ends. Pinion 62 is located and dimensioned so that its gear teeth will be effective to engage and mesh with the geared head of the effective screw 46 (namely the lowermost screw as viewed in FIG. 2) regardless of the particular axial position of that screw. Pinion 62 is positioned so that it is normally disengaged from, but directly below (as viewed in FIG. 2), the geared head of the effective tuning screw 46. Pinion 62 is normally prevented from engaging the screw by the effect of a wire spring 63 which biases or urges stub 57*a* downward.

Upward movement of carriage 57 and adjustment of the effective screw 46 is achieved by a metallic fine tuning hollow shaft 66 which is concentric with, but is independently rotatable with respect to, channel selection tuning shaft 41. A flat is provided at the free end of shaft 66 to permit the attachment of a fine tuning control knob 67. Concentric channel selector and fine tuning knobs may thus be employed. A plastic gear 68, affixed to the other end of shaft 66, lies in the same plane as and meshes with pinion 61. They remain in mesh even when carriage 57 is in its normal position. A plastic cam 69 is loosely mounted over shaft 66 in order that the shaft may be rotated without rotating the cam. However, cam 69 is mechanically coupled to shaft 66 by a slip-clutch device that causes the cam to pivot or rock in response to the initial rotation of fine tuning shaft 66, whether it be in a clockwise or counterclockwise direction. Specifically, a safety pin type clutch spring 71 is positioned in an annular groove 66*a* formed in shaft 66. An upper portion of the clutch spring seats in and is retained by a slot formed in a projecting portion 69*a* of cam 69. Clutch spring 71 exerts pressure on groove 66*a* namely a radially inward force, to introduce sufficient friction so that initial rotation of shaft 66 causes spring 71, and consequently cam 69, to pivot from its home position shown in FIG. 2 in the direction in which the shaft is rotated.

Figure 2:
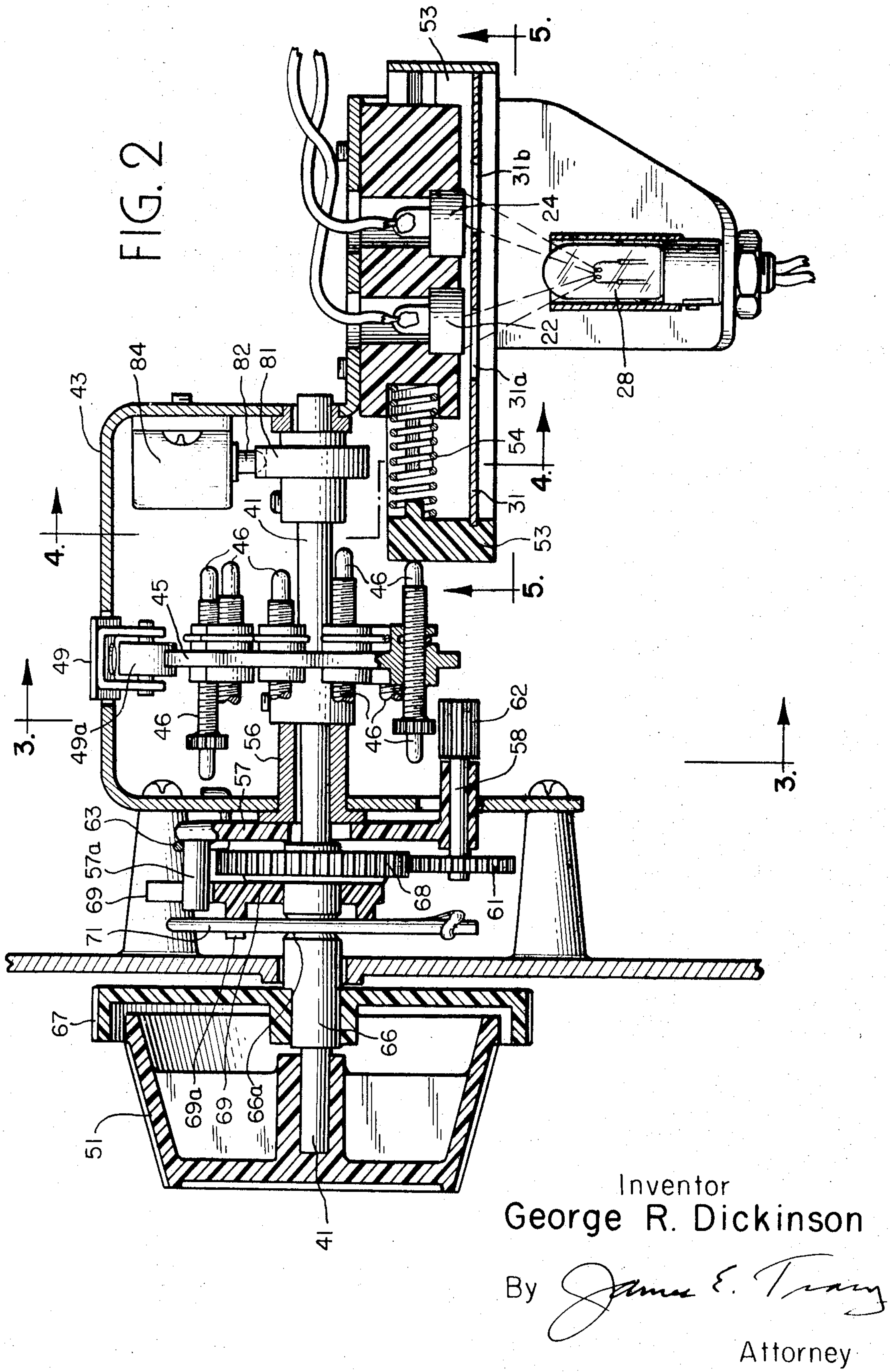
FIG. 2 is a sectional view of the mechanical details of the tuner and shows substantially all of the apparatus for producing an adjustable amplitude DC control voltage in each tuner position; in other words, only the tunable circuitry, controlled by the control voltage, is missing in FIG. 2.

The top of cam 69 is V-shaped to present a pair of converging camming surfaces, only one of which is shown in FIG. 2. Pin 57*a* extends into that V and normally lies at the vertex thereof. Depending on the rotation of can 69, one of the camming surfaces pushes pin 57*a* upwards and against the tension of spring 63. Carriage 57 thus moves upwardly and pinion 62 is shifted into engagement with the effective tuning screw 46. Upward movement of pin 57*a* ceases when pinion 62 meshes with the tuning screw and when pinion 61 is fully in mesh with gear 68. In response to continued rotation of fine tuning shaft 66, clutch spring 71 slips in groove 66*a* thus permitting gear 68 to continue to rotate while cam 69 remains fixed in position. As a consequence, pinion 61 rotates and in turn causes pinion 62 to screw the effective screw 46 to the precise axial position required to effect tuning to the desired channel. When rotational force is removed by the operator from shaft 66, pin 57*a*, under the tension of spring 63, now acts as a cam and urges cam 69 to its home position.

Of course, any other appropriate fine tuning mechanism may be employed to preset each of screws 46. The particular one shown is also illustrated and described in more detail in copending application Ser. No. 718,839, filed Apr. 4, 1968 in the name of George R. Dickinson, and assigned to the assignee of the present application.

Since the 82 television channels are spread out over three spaced-apart portions or bands of the frequency spectrum, with wide voids or discontinuities between the portions, it is most convenient to employ varactor-diode tuning circuitry having different circuit elements which are functionally included or switched into the tunable circuits in each of the different bands. For example, for operation in the high VHF band sections of the inductance coils of the tunable circuits, used for low VHF operation, may be shorted out and thus effectively removed.

The illustrated arrangement includes a provision for switching bands in tunable circuitry 20, depending on the frequency of the desired channels. As seen in FIG. 3, only three of the tuner positions are allocated for pretuning to the low VHF channels 2—6, three for the high VHF channels 7——13, and the remaining four positions are devoted to the UHF channels 14—83. A cam 81 (best seen in FIG. 4), fixed to shaft 41, has three lobes (camming surfaces of different radii) around its periphery which are correlated with the channel assignments shown in FIG. 3. A cam follower 82, spring biased or urged toward shaft 41, rides on the periphery or lobes of cam 81 and for each position of the tuner the cam follower will be moved by cam 81 to a location in accordance with the band assignment for that tuner position. For example, the tuner position shown is one of those three devoted to preset tuning of the high VHF channels 7—13. The particular lobe engaged by cam follower 82 in FIG. 4 is that which is common or assigned to the high VHF channels. Follower 82 in turn controls band switching circuitry, schematically shown by element 84, electrically connected to the tunable circuitry 20 of FIG. 1.

While shutter assembly 31, 53, 54 is shared by all of the tuner positions, the invention is susceptible of many different variations where this would not be the case. For example, entirely different adjustable mechanisms with no common elements may be provided for performing the functions of screws 46 and the shutter assembly in the different tuner positions. Moreover, a variety of different means are available to vary the amount of light reaching the light-sensitive device or devices. As one example, an adjustable iris diaphragm may be utilized. As another alternative, a pair of relatively movable polarized filters may be employed.

The invention provides, therefore, a novel tuning system in which channel selection may be made without requiring the movement of any sliding or wiping contacts. In the illustrated case, only band switching is employed and this is not absolutely essential. In any event, as to the selection of channels in any one band, absolutely no switching contacts of any form are required. Since no contacts need be moved in going from one tuner position to the next, tuner manipulation may be performed with very little torque and this eases considerably the effort required by the operator. Furthermore, when a remote control drive is desired, the low torque requirement allows the use of a relatively inexpensive mechanical drive rather than an expensive motor as has been necessary in the past.

While a particular embodiment of the invention has been shown and described, it is obvious to those skilled in the art that changes and modifications may be made without departing from the invention in its broader aspects, and therefore, it is intended in the appended claims to cover all such modifications and changes as may follow within the true spirit and scope of the invention.

I claim:

1. A tuner for selectively tuning a wave-signal receiver to any one of several different broadcast channels, comprising:

a light-controllable voltage source including a pair of light-dependent resistors and a source of unidirectional potential for providing, in response to incident light received by said resistors, a voltage of a magnitude determined by the amount of such incident light;

control means for exposing said light-sensitive resistors to a controllable amount of light to effect the development, by said light-controllable source, of a control voltage whose amplitude is variable as between several different discrete amplitude levels each of which is assigned to, and effectively designates, a different respective one of said channels; and tunable means responsive to said control voltage for tuning said receiver to the particular channel designated by the control-voltage amplitude level at the time, in which said two light-dependent resistors and said source of unidirectional potential are series connected and said control voltage is derived at the junction of the two light-dependent resistors, and in which said control means exposes both of said light-dependent resistors to variable quantities of light, the amount striking each resistor being inversely proportional to that impinging the other.

2. A tuner for selectively tuning a wave signal receiver to any one of several different broadcast channels, comprising:

a light-controllable voltage source including at least one light-sensitive device for providing, in response to incident light received by said device, a voltage of a magnitude determine by the amount of such incident light;

control means for exposing said light-sensitive device to a controllable amount of light to effect the development, by said source, of a control voltage whose amplitude is variable as between several different discrete amplitude levels each of which is assigned to, and effectively designates, a different respective one of said channels;

tunable means responsive to said control voltage for tuning said receiver to the particular channel designated by the control-voltage amplitude level at the time; and said tuner having a plurality of different positions, in which said control means includes an adjustable mechanism for selecting the amount of light falling on said light-sensitive device in each tuner position, thereby to permit the adjustment of the control voltage amplitude to a different level in each position to achieve tuning to a different channel in each position.

3. A tuner for selectively tuning a wave signal receiver to any one of several different broadcast channels, comprising:

a light-controllable voltage source including at least one light-sensitive device for providing, in response to incident light received by said device, a voltage of a magnitude determined by the amount of such incident light;

control means for exposing said light-sensitive device to a controllable amount of light to effect the development, by said source, of a control voltage whose amplitude is variable as between several different discrete amplitude levels each of which is assigned to, and effectively designates, a different respective one of said channels;

tunable means responsive to said control voltage for tuning said receiver to the particular channel designated by the control-voltage amplitude level at the time;

said tuner being step-by-step actuatable from one to another of a series of discrete tuner positions in each of which a different respective assigned one of a corresponding series of adjustable controls, included in said control means, is effective and may be preset to select the amount of light to be received by said light-sensitive device in that position, thereby facilitating preset tuning to a different selected channel in each tuner position.

4. A tuner according to claim 3 in which said control means includes a common movable element, effective in all tuner positions, for controlling the light exposure of said light-sensitive device and which is positionable, in each tuner position, by the adjustable control assigned to that position.